(12) United States Patent
Ball

(10) Patent No.: US 7,391,242 B1
(45) Date of Patent: Jun. 24, 2008

(54) SAWTOOTH WAVEFORM GENERATOR

(76) Inventor: Newton E. Ball, 960 San Lazaro Ct., Hemet, CA (US) 92543-6834

( * ) Notice: Subject to any disclaimer, the term of this patent is extended or adjusted under 35 U.S.C. 154(b) by 0 days.

(21) Appl. No.: 11/697,727

(22) Filed: Apr. 7, 2007

(51) Int. Cl.
 *H03K 4/06* (2006.01)
(52) U.S. Cl. ...................................... 327/131
(58) Field of Classification Search ............... 327/131, 327/558
See application file for complete search history.

(56) References Cited

U.S. PATENT DOCUMENTS

| | | | |
|---|---|---|---|
| 3,586,874 A | 6/1971 | Ferro | |
| 4,227,124 A | 10/1980 | Elliott, Jr. | |
| 4,355,240 A | 10/1982 | Hamilton | |
| 4,490,653 A | 12/1984 | Olmstead | |
| 4,885,585 A | 12/1989 | Barrow et al. | |
| 5,336,242 A | 8/1994 | Zadeh | |
| 5,574,392 A | 11/1996 | Jordan | |
| 5,642,066 A | 6/1997 | Burke | |
| 5,760,623 A | 6/1998 | Hastings | |
| 5,769,873 A | 6/1998 | Zadeh | |
| 5,804,999 A | 9/1998 | DeBoer et al. | |
| 6,172,489 B1 | 1/2001 | Walker | |
| 6,194,946 B1 | 2/2001 | Fowers | |
| 6,522,115 B1 | 2/2003 | Greitschus | |
| 6,819,154 B2 | 11/2004 | Greenfield | |
| 6,900,440 B2 | 5/2005 | Reed et al. | |
| 2004/0174209 A1* | 9/2004 | Makino et al. | ............... 327/558 |

* cited by examiner

*Primary Examiner*—Quan Tra
(74) *Attorney, Agent, or Firm*—Jerry Turner Sewell

(57) ABSTRACT

A sawtooth waveform generator includes an operational amplifier that generates a ramp signal. The ramp signal charges a capacitor connected between the output of the operational amplifier and the inverting input of the operational amplifier. The inverting input is maintained at a substantially constant voltage, which provides a substantially constant charging current through a timing resistor. The connections to the capacitor are switched when the ramp voltage reaches a predetermined level. A control circuit switches the connections to the capacitor in response to a voltage on one terminal of the capacitor to assure that the connections to the capacitor are switched to a configuration to cause the direction of current flow through the capacitor to be reversed as a result of the switching.

4 Claims, 2 Drawing Sheets

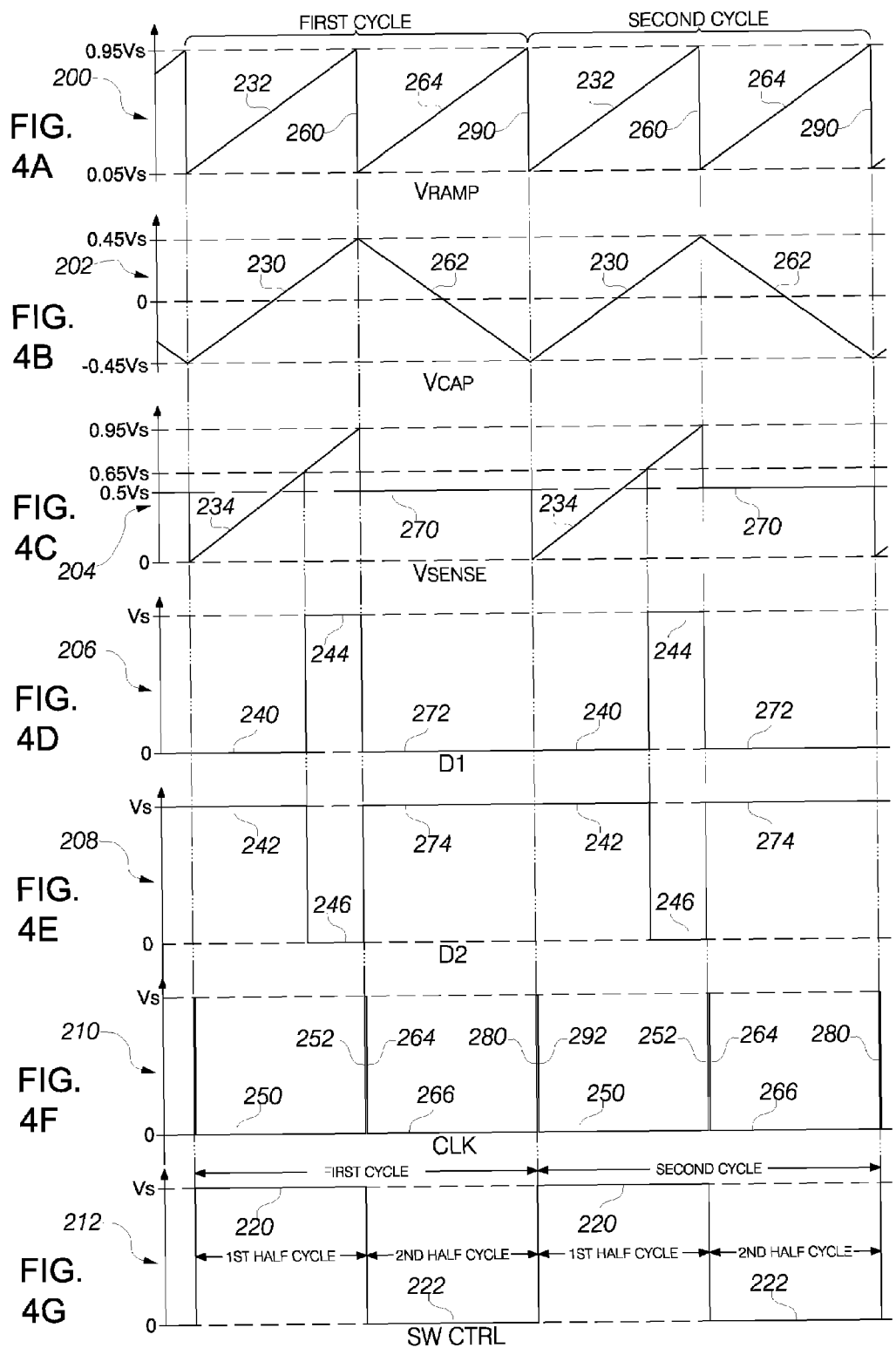

SAWTOOTH WAVEFORM GENERATOR

BACKGROUND OF THE INVENTION

1. Field of the Invention

The present invention is generally in the field of electrical waveform generators, and, more particularly, is in the field of sawtooth waveform generators having an operational amplifier with a switched capacitor between the output and the inverting input.

2. Description of the Related Art

A sawtooth waveform is a periodic waveform that has a ramp portion that changes linearly from a starting value to an ending value during a predetermined time interval and then resets rapidly to the starting value at the beginning of the next time interval. Generally, the ramp portion increases from a low starting value to a high ending value during each time interval; however, for some applications, the ramp portion may decrease during the time interval.

Sawtooth waveforms are commonly used in pulse width modulation (PWM) systems, in frequency synthesizers and other systems requiring a signal that changes linearly over a predetermined time interval.

Historically, a sawtooth waveform was generated by charging a capacitor using a constant current source and then discharging the capacitor at the end of each time interval. However, discharging the capacitor at the end of each interval required a finite time and caused the reset transition of the sawtooth waveform to have a slope determined by the impedance in the discharge circuit. Although the time required to reset the waveform may be insignificant for a low frequency sawtooth waveform, the time required to reset the waveform is a significant portion of the overall period for a higher frequency sawtooth waveform, thus causing the sawtooth waveform to have the appearance of a triangular waveform.

More recently, sawtooth waveform generators have not discharged the capacitor to reset the sawtooth waveform to the starting value. Rather, when the ramp voltage on the output of the operational amplifier reaches a maximum value at the end of each time interval, the connections to the capacitor between the output of the operational amplifier and the inverting input of the operational amplifier are rapidly switched while maintaining the charge on the capacitor. The switching of the connections to the capacitor causes the operational amplifier to rapidly switch the voltage on the output of the operational amplifier to maintain the voltage on the inverting input substantially equal to a reference voltage on the non-inverting input. The capacitor is then linearly charged in the opposite direction as the operational amplifier generates an identical ramp voltage during a second time interval. Since the capacitor is not rapidly discharged between the time intervals, the reset transition occurs as quickly as the connections to the capacitor are reversed and the operational amplifier responds to the reversed voltage on the inverting input.

Known sawtooth waveform generators using the above-described switched capacitor rely on flip-flops to switch the connections to the capacitor during alternating time intervals; however, the circuitry controlling the flip-flops is subject to entering an unknown state or failing to switch at the end of an interval such that the sawtooth waveform generator may halt.

SUMMARY OF THE INVENTION

One aspect of embodiments in accordance with the present invention is a sawtooth waveform generator having an operational amplifier that generates a ramp signal that charges a capacitor connected between the output of the operational amplifier and the inverting input of the operational amplifier. The inverting input is maintained at a substantially constant voltage, which is applied across at least one resistor to provide a substantially constant charging current. The ramp voltage is monitored, and the connections to the capacitor are switched when the ramp voltage reaches a predetermined level. The voltage on one terminal of the capacitor is also monitored. The circuitry that controls the switching of the capacitor is responsive to the voltage on the terminal of the capacitor to assure that the connections to the capacitor are switched to cause the direction of current flow through the capacitor to be reversed as a result of the switching.

Another aspect of embodiments in accordance with the present invention is a sawtooth waveform generator that comprises an operational amplifier that generates a ramp voltage on an output terminal. A timing circuit controls the risetime of the ramp voltage generated by the operational amplifier. The timing circuit comprises a capacitor having a first terminal and a second terminal. A switching circuit operates during a first interval to connect the first terminal of the capacitor to the output of the operational amplifier and to connect the second terminal of the capacitor to an input of the operational amplifier. The switching circuit operates during a second interval to connect the second terminal of the capacitor to the output of the operational amplifier and to connect the first terminal of the capacitor to the input of the operational amplifier. A control circuit controls the switching circuit. The control circuit is responsive to the ramp voltage to cause the switching circuit to switch at a predetermined voltage level. The control circuit is responsive to a voltage level on the first terminal of the capacitor to select which of the first terminal and the second terminal of the capacitor to connect to the output terminal of the operational amplifier.

Another aspect of embodiments in accordance with the present invention is a sawtooth waveform generator that comprises a timing capacitor having a first terminal and a second terminal. An operational amplifier has a first input terminal, a second input terminal and an output terminal. The first input terminal is connected to a fixed voltage source. The second input terminal is connected to a timing resistor. The operational amplifier generates a ramp voltage that varies at a rate determined by the capacitor and the timing resistor. A first switch and a second switch connect the timing capacitor between the output terminal and the second input terminal of the operational amplifier. The first and second switches have a first switch state in which the first terminal of the timing capacitor is connected to the output of the operational amplifier and the second terminal of the timing capacitor is connected to the second input terminal of the operational amplifier to cause current to flow from the second terminal of the timing capacitor and through the timing resistor. The first and second switches have a second state in which the second terminal of the timing capacitor is connected to the output of the operational amplifier and the first terminal of the timing capacitor is connected to the second input terminal of the operational amplifier to cause current to flow from the first terminal of the timing capacitor and through the timing resistor. A control circuit is responsive to the ramp voltage and is responsive to a voltage on a selected one of the first terminal and the second terminal of the timing capacitor. The control circuit provides a control signal to control the first and second switches. The control signal switches the first and second switches to the first switch state when the ramp voltage reaches a predetermined level and when the voltage on the selected one of the first terminal and the second terminal of the timing capacitor is greater than a selected voltage level.

The control signal switches the first and second switches to the second switch state when the ramp voltage reaches the predetermined level and when the voltage on the selected one of the first terminal and the second terminal of the timing capacitor is less than the selected voltage level.

Another aspect of embodiments in accordance with the present invention is a method for generating a sawtooth waveform. The method comprises connecting one of a first terminal and a second terminal of a timing capacitor to an output terminal of an operational amplifier and connecting the other of the first terminal and the second terminal of the timing capacitor to an input terminal of the operational amplifier and to a timing resistor. The method generates a linearly varying ramp signal from the output terminal of the operational amplifier to charge the timing capacitor. The method monitors the ramp signal and a voltage on a selected terminal of the timing capacitor until the ramp voltage reaches a predetermined level, and then performs a selected one of actions. When the ramp signal reaches the predetermined level and the voltage on the selected terminal of the timing capacitor has a first voltage level, the method switches the connections to the timing capacitor to connect the first terminal of the timing capacitor to the output of the operational amplifier and to connect the second terminal of the timing capacitor to the input terminal of the operational amplifier and to the timing resistor. In this configuration, the method charges the timing capacitor in a first direction. When the ramp signal reaches the predetermined level and the voltage on the selected terminal of the timing capacitor has a second voltage level, the method switches the connections to the timing capacitor to connect the second terminal of the timing capacitor to the output of the operational amplifier and to connect the first terminal of the timing capacitor to the input terminal of the operational amplifier and to the timing resistor. In this configuration, the method charges the timing capacitor in a second direction opposite the first direction.

BRIEF DESCRIPTION OF THE DRAWINGS

The foregoing aspects and other aspects of this disclosure are described in detail below in connection with the accompanying drawing figures in which:

FIG. 4A illustrates a waveform of the $V_{RAMP}$ signal generated by the output terminal of the operational amplifier of FIG. 1;

FIG. 4B illustrates a waveform of the $V_{CAP}$ voltage across the timing capacitor of FIG. 1;

FIG. 4C illustrates a waveform of the $V_{SENSE}$ voltage on the output of the first switch in FIG. 1;

FIG. 4D illustrates a waveform of the D1 direction signal on the output terminal of the first comparator in FIG. 1;

FIG. 4E illustrates a waveform of the D2 direction signal on the output terminal of the inverter in FIG. 1;

FIG. 4F illustrates a waveform of the clock (CLK) signal on the output terminal of the second comparator in FIG. 1; and FIG. 4G illustrates a waveform of the switch control (SW CTRL) generated by the bistable logic circuit in FIG. 1.

DETAILED DESCRIPTION OF A PREFERRED EMBODIMENT

Figure 1:
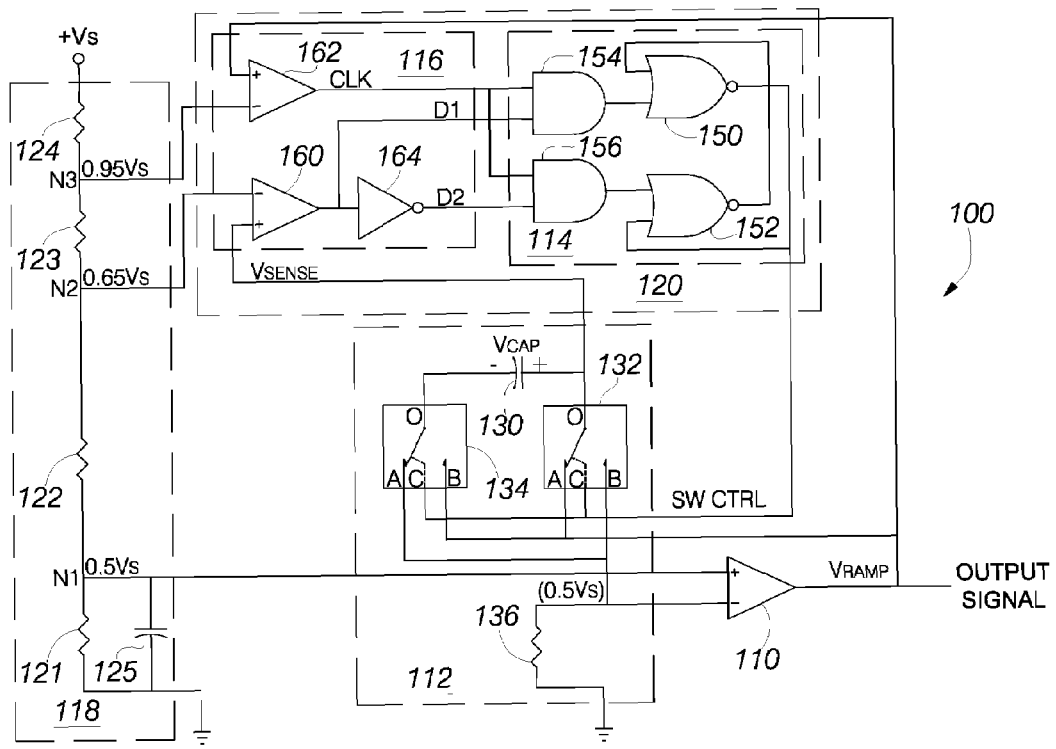
FIG. 1 illustrates a schematic diagram of an embodiment of a sawtooth waveform generator in accordance with aspects of the present invention.

FIG. 1 illustrates a schematic diagram of an embodiment of a sawtooth waveform generator 100 in accordance with aspects of the present invention. The sawtooth waveform generator 100 comprises an operational amplifier 110, a ramp generation timing circuit 112, a bistable logic circuit 114, a sensing circuit 116 and a reference voltage network 118. The bistable logic circuit 114 and the sensing circuit 116 operate together as a control circuit 120.

In the illustrated embodiment, the reference voltage network 118 comprises a first resistor 121, a second resistor 122, a third resistor 123 and a fourth resistor 124 connected in series between a circuit ground and a power supply voltage (+Vs). Although not shown in FIG. 1, the power supply voltage +Vs is also provided as the supply voltage to the analog and digital components in the sawtooth waveform generator 100.

The values of the four resistors 121-124 are selected to provide voltages at respective nodes N1, N2, N3 that are approximate predetermined percentages of the power supply voltage. For example, in the illustrated embodiment, the first resistor 121 has a resistance of approximately 11,100 ohms between the circuit ground and the first node N1. The second resistor 122 has a resistance of approximately 3,300 ohms between the first node N1 and the second node N2. The third resistor 123 has a resistance of approximately 6,800 ohms between the second node N2 and the third node N3. The fourth resistor 124 has a resistance of approximately 1,000 ohms between the third node N3 and the power supply voltage (+Vs). Although shown as single resistors, any of the resistors 121-124 may comprise more than one resistor connected in series or parallel to obtain a desired resistance.

In the illustrated embodiment, the selected resistor values cause the voltage at the first node N1 to be approximately +Vs×0.5 (designated as "0.5 Vs" in the drawings). The voltage at the second node N2 is approximately +Vs×0.65 ("0.65 Vs"). The voltage at the third node N3 is approximately +Vs×0.95 ("0.95 Vs"). When the supply voltage is at a nominal voltage of approximately 5 volts, the voltages at the first node N1, the second node N2 and the third node N3 are approximately 2.5 volts, 3.25 volts and 4.75 volts respectively. In the illustrated embodiment, a filter capacitor 125 is connected across the first resistor 121 between the first node N1 and the circuit ground to reduce noise that may appear across the first resistor 121.

The operational amplifier 110 has a non-inverting (+) input terminal, an inverting (−) input terminal and an output terminal. The non-inverting (+) input terminal is connected to the first node N1 and is thus maintained at approximately one-half the supply voltage (e.g., 2.5 volts in the illustrated embodiment). The inverting (−) input terminal is connected to the ramp generation timing circuit, as described in detail below.

In the illustrated embodiment, the operational amplifier 110 is advantageously an EL5210 low power, high voltage rail-to-rail input-output operational amplifier, which is commercially available from Intersil Corporation. The EL5210 operational amplifier is capable of driving the output terminal to a voltage within 100 millivolts of the positive supply voltage and the negative supply voltage. Other operational amplifiers having similar characteristics can also be used.

The ramp generation timing circuit 112 comprises a timing capacitor 130, a first switch 132, a second switch 134 and a timing resistor 136. In the illustrated embodiment, the timing capacitor 130 has a capacitance of approximately 220 picofarads, and the timing resistor 136 has a resistance of approximately 33,000 ohms.

Each of the first switch 132 and the second switch 134 is an electronically controlled analog switch (e.g., a semiconductor switch) having a respective first input terminal (A), a respective second input terminal (B), a respective output terminal (O) and a respective control terminal (C). For example, in the illustrated embodiment, each switch advantageously comprises an FSA3157 low voltage single pole/double throw analog switch, which is commercially available from Fairchild Semiconductor. The FSA3157 switches have low on-resistances (e.g., less than approximately 10 ohms) and fast turn-on times (e.g., less than 10 nanoseconds). Other similar devices can also be used.

The timing capacitor 130 has a first terminal (labeled with a "+" sign on the right in FIG. 1) connected to the output terminal (O) of the first switch 132. The timing capacitor 130 has a second terminal (labeled with a "−" sign on the left in FIG. 1) connected to the output terminal (O) of the second switch 134. As discussed below, the timing capacitor 130 has a time-varying voltage between the first terminal and the second terminal, which is identified as $V_{CAP}$ in FIG. 1. The timing capacitor 130 is not polarized, and the positive and negative signs are provided for reference in the following discussion. The "+" terminal of the capacitor 130 and the output terminal of the first switch 132 are also connected to a signal line identified as $V_{SENSE}$.

The first input terminal (A) of the first switch 132 is connected to the second input terminal (B) of the second switch 134. The second terminal input (B) of the first switch 132 is connected to the first input terminal (A) of the second switch 134. The control terminal (C) of the first switch 132 is connected to the control terminal (C) of the second switch 134. The control terminals (C) are controlled by a control signal (SW CTRL) from the bistable logic circuit 114, as discussed in more detail below.

Each switch 132, 134 is responsive to a control voltage on the respective control terminal (C) to electrically interconnect one of the respective first input terminal (A) and the respective second input terminal (B) to the respective output terminal (O). In the illustrated embodiment, a relatively high voltage corresponding to a high logic level (e.g., a logical "1") on the respective control terminal (C) of each switch causes the respective first input terminal (A) to be electrically connected to the respective output terminal (O). A low voltage corresponding to a low logic level (e.g., a logical "0") on the respective control terminal (C) causes the respective second input terminal (B) to be electrically connected to the respective output terminal (O).

The interconnected first input terminal (A) of the first switch 132 and second input terminal (B) of the second switch 134 are connected to a respective first terminal of the timing resistor 136. A respective second terminal of the timing resistor 136 is connected to circuit ground.

The interconnected first input terminal (A) of the second switch 134 and second input terminal (B) of the first switch 134 are also connected to the inverting (−) input terminal of the operational amplifier 110. The interconnected second input terminal (B) of the second switch 134 and first input terminal (A) of the first switch 134 are connected to the output input terminal of the operational amplifier 110. Thus, the timing capacitor 130 is electrically connected between the output terminal of the operational amplifier 110 and the inverting (−) input terminal of the operational amplifier 110; however, as discussed below, the two switches 132, 134 cause the connections between the timing capacitor 130 and the operational amplifier 110 to be selectively reversed in accordance with the logic level on the control inputs (C) of the switches.

Figure 2:
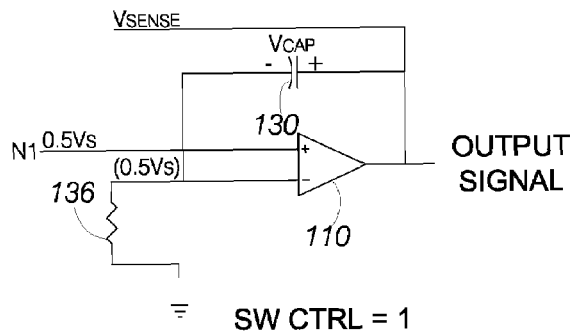
FIG. 2 illustrates the effective electrical connections to the timing capacitor of FIG. 1 when the SW CTRL signal has a high logic level and each switch has the respective first input connected to the respective output.
Figure 3:
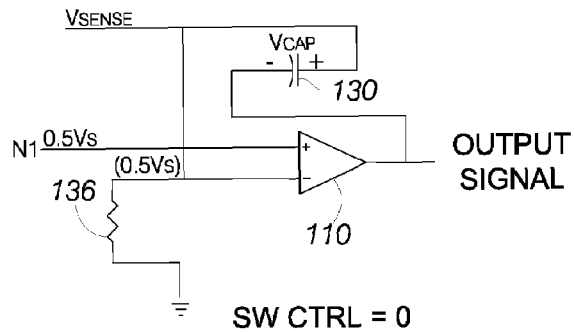
FIG. 3 illustrates the effective electrical connections to the timing capacitor of FIG. 1 when the SW CTRL signal has a low logic level and each switch has the respective second input connected to the respective output.

The operation of the two switches 132, 134 is illustrated in FIG. 2 and FIG. 3. In FIG. 2, a high control voltage is applied to the control inputs (C) to cause the respective first inputs (A) of the switches to be electrically connected to the respective outputs (O) as also illustrated in FIG. 1. In FIG. 3, a low control voltage is applied to the control inputs (C) to cause the respective second inputs (B) of the switches to be electrically connected to the respective outputs (O). In FIGS. 2 and 3, the switches are not shown and only the resulting effective connections are shown.

In FIG. 2, the output of the operational amplifier 110 is electrically connected to the "+" terminal of the timing capacitor 130 and to the $V_{SENSE}$ signal line. The timing resistor 136 and the inverting (−) input terminal of the operational amplifier 110 are electrically connected to the "−" terminal of the timing capacitor 130. The operational amplifier 110 operates to maintain a substantially zero voltage difference between the inverting (−) input terminal and the non-inverting (+) input terminal. Since the voltage on the non-inverting (+) input terminal is maintained at a substantially constant percentage of the supply voltage (e.g., 0.5 Vs in the illustrated example), the inverting (−) input terminal is also maintained at approximately 0.5 Vs. The inverting (−) input terminal is thus maintained at a virtual reference voltage of 0.5 Vs as shown in parentheses in FIGS. 1, 2 and 3.

Since the inverting (−) input terminal is maintained at a substantially constant voltage by the operation of the operational amplifier 110, a substantially constant current will flow through the timing resistor 136. For example, with the resistance values discussed above, the constant current is approximately 76 microamperes when the power supply voltage (+Vs) is nominally 5 volts. Because of the high input impedance of the operational amplifier 110, the substantially constant current flows from the "−" terminal of the timing capacitor 130. In FIG. 2, the direction of the constant current flow out of the "−" terminal charges the timing capacitor 130 in the direction from the "+" terminal to the "−" terminal to increase the voltage on the "+" terminal at a rate determined by the current flow through the timing resistor 136. As discussed below, the voltage on the "+" terminal increases from a value less than the voltage on the "−" terminal to a value greater than the voltage on the "−" terminal.

In FIG. 3, the output of the operational amplifier 110 is electrically connected to the "−" terminal of the timing capacitor 130. The timing resistor 136 and the inverting (−) input terminal of the operational amplifier 110 are electrically connected to the "+" terminal of the timing capacitor 130. Accordingly, the "+" terminal of the capacitor 130 and the $V_{SENSE}$ signal line are maintained at the substantially constant percentage of the supply voltage (e.g., 0.5 Vs). In FIG. 3, the direction of the constant current flow out of the "+" terminal charges the timing capacitor 130 in the direction from the "−" terminal to the "+" terminal to increase the voltage on the "−" terminal at a rate determined by the current flow through the timing resistor 136. As discussed below, the voltage on the "−" terminal increases from a value less than the voltage on the "+" terminal to a value greater than the voltage on the "+" terminal.

As briefly discussed above, the two switches are controlled by the bistable logic circuit 114. Previous versions of similar circuits for controlling a sawtooth waveform generator have used a J-K (or toggle) flip-flop in the place of a bistable logic circuit; however, such J-K circuits have been shown to occasionally enter a condition wherein the outputs of the J-K flip-flop are not well-defined. In such cases, the J-K flip-flop stops toggling, thus interrupting the generation of the sawtooth waveform.

The bistable logic circuit 114 is configured as a set-reset flip-flop controlled by the sensing circuit 116. The sensing circuit 116 is configured to guarantee that the bistable circuit 114 never enters into an undefined condition.

In the illustrated embodiment, the bistable logic circuit 114 comprises a first NOR-gate 150 and a second NOR-gate 152. Each NOR-gate has a respective first input terminal, a respective second input terminal and a respective output terminal. The two NOR-gates are cross coupled with the output terminal of the first NOR-gate 150 connected to the first input terminal of the second NOR-gate 152 and with the output terminal of the second NOR-gate 152 connected to the first input terminal of the first NOR-gate 150. The output terminal of the first NOR-gate 152 is also the output terminal of the bistable logic circuit 114. The second input of the first NOR-gate 150 is connected to an output terminal of a first AND-gate 154. The second input of the second NOR-gate 152 is connected to an output terminal of a second AND-gate 156.

Each AND-gate 154, 156 has a respective first input terminal and a respective second input terminal. The first input terminals of the two and gates are connected together and are connected to a clock (CLK) output of the sensing circuit 116. The second input terminal of the first AND-gate 154 is connected to a first direction (D1) output terminal of the sensing circuit 116. The second input terminal of the second AND-gate 156 is connected to a second direction (D2) output terminal of the sensing circuit 116. As discussed below, the first direction (D1) output terminal and the second direction (D2) output terminal always have opposite logic levels. When the logic level on the D1 terminal is high, the logic level on the D2 terminal is low, and when the logic level on the D1 terminal is low, the logic level on the D2 terminal is high.

The bistable logic circuit 114 is responsive to a transition from a low logic level to a high logic level on the clock (CLK) output terminal of the sensing circuit 116 to change the logic state of the two cross-coupled NOR-gates 150, 152 to a state determined by the logic levels on the D1 output terminal and the D2 output terminal of the sensing circuit 116. In particular, when the logic level on the D2 output terminal is high and the logic level on the D1 output terminal is low, the output terminal of the second NOR-gate 152 is forced to a low logic level by the two high logic levels on the two input terminals of the second AND-gate 156. The low logic levels on the two input terminals of the first NOR-gate 150 sets the output terminal of the first NOR-gate to a high logic level, thus causing the output of the bistable logic circuit 114 to be at a high logic level. Similarly, when the logic level on the D1 output terminal is high and the logic level on the D2 output terminal is low, the output terminal of the first NOR-gate 150 is reset to a low logic level, thus causing the output of the bistable logic circuit 114 to be at a low logic level.

The sensing circuit 116 comprises a first comparator 160, a second comparator 162 and an inverter 164. The first comparator 160 and the second comparator 162 advantageously comprise operational amplifiers configured with a respective inverting (−) input terminal, a respective non-inverting (+) input terminal, and a respective output terminal. In the illustrated embodiment, the operational amplifiers comprise Intersil EL5210 operational amplifiers, as described above. The operational amplifiers are connected in an open loop configuration such that when the voltage on the respective non-inverting (+) input terminal is greater than the voltage on the respective inverting (−) input terminal, the voltage on the respective output terminal will be approximately the same as the power supply voltage (e.g., +5 volts). In contrast, when the voltage on the respective non-inverting (+) input terminal is less than the voltage on the respective inverting (−) input terminal, the voltage on the respective output terminal will be approximately the same as the circuit ground (e.g., zero volts).

The inverting (−) input terminals of the first comparator 160 and the second comparator 162 are connected to respective reference voltage nodes and the non-inverting (+) input terminals of the two comparators are connected to respective time-varying voltages. In particular, the inverting (−) input of the first comparator 160 is connected to the second node N2 and is thus connected to a voltage that is approximately 65 percent of the supply voltage (e.g., 3.25 volts when the supply voltage is nominally 5 volts). The inverting (−) input of the second comparator 162 is connected to the third node N3 and is thus connected to a voltage that is approximately 95 percent of the supply voltage (e.g., 4.75 volts when the supply voltage is nominally 5 volts).

The non-inverting (+) input terminal of the second comparator 162 is connected to the output terminal of the operational amplifier 110 to receive a ramp voltage ($V_{RAMP}$). As described below, the second comparator 162 operates as a ramp voltage sensor to determine when the sawtooth waveform has reached a maximum value.

The non-inverting (+) input terminal of the first comparator 160 is connected to the output terminal of the first switch 132 to receive a sensed voltage ($V_{SENSE}$), which is the voltage on the "+" terminal of the timing capacitor 130 referenced to the circuit ground. The sensed voltage ($V_{SENSE}$) is substantially equal to the ramp voltage ($V_{RAMP}$) when the switch control (SW CTRL) is a logical 1 as shown in FIG. 2. The sensed voltage ($V_{SENSE}$) is substantially equal to the virtual reference voltage ((0.5 Vs)) when the switch control (SW CTRL) is a logical 0 as shown in FIG. 3. As described below, the first comparator 160 operates as a capacitor voltage sensor to determine the direction of current flow through the capacitor 130 and thus determine the states of the two switches 132, 134.

The inverter 164 has an input terminal and an output terminal. The input terminal receives the D1 signal from the output terminal of the first comparator 160. The inverter 164 inverts the D1 signal and generates the D2 signal. Thus, when the D1 signal is at a high logic level, the D2 signal is at a low logic level. When the D1 signal is at a low logic level, the D2 signal is at a high logic level. As discussed above, the D1 signal and the D2 signal control the state of the bistable logic circuit 114.

The operation of the sawtooth waveform generation circuit 100 is illustrated by the waveforms in FIGS. 4A-4G.

FIG. 4A illustrates a waveform 200 of the $V_{RAMP}$ signal generated by the output terminal of the operational amplifier 110. FIG. 4B illustrates a waveform 202 of the $V_{CAP}$ voltage across the timing capacitor 130. FIG. 4C illustrates a waveform 204 of the $V_{SENSE}$ voltage on the output of the first switch 132. FIG. 4D illustrates a waveform 206 of the D1 direction signal on the output terminal of the first comparator 160. FIG. 4E illustrates a waveform 208 of the D2 direction signal on the output terminal of the inverter 164. FIG. 4F illustrates a waveform 210 of the clock (CLK) signal on the output terminal of the second comparator 162. FIG. 4G illustrates a waveform 212 of the switch control (SW CTRL) generated by the bistable logic circuit 114.

The following discussion is referenced to the switch control signal waveform 212 in FIG. 4G. As illustrated, the switch control signal (SW CTRL) comprises a first portion 220 having a high logic level during a first half-cycle of a first cycle followed by a second portion 222 having a low logic level during a second half-cycle of the first cycle. Each subsequent cycle (e.g., a second cycle) comprises a respective first portion 220 during the first half-cycle and a respective second portion 222 during the second half-cycle. Accordingly, during the first half-cycle of each cycle, the first input terminal A of each of the switches 132, 134 is connected to the respective output terminal O. The "+" terminal of the timing capacitor 130 is connected to the output terminal of the operational amplifier 110 via the first switch 132. The "−" terminal of the timing capacitor 130 is connected to the inverting (−) input terminal of the operational amplifier 110 and to the timing resistor 136 via the second switch 134.

Note that the references to cycles and half-cycles in the descriptions of FIGS. 4A-4G relate to the annotations shown on the drawings. The sawtooth waveform produced by the output of the operational amplifier 110 completes a full cycle during each half-cycle. Accordingly, the frequency of the sawtooth waveform is twice the repetition rate of the switch control signal (SW CTRL). The frequency is determined by the rise time of ramp voltage waveform shown in FIG. 4A. In the illustrated embodiment with the values described herein, the Vramp signal has a period of approximately 13.03 microseconds and thus has a frequency of approximately 76.75 kilohertz.

As will be shown below, at the beginning of each first half-cycle, the voltage on the output terminal of the operational amplifier 110 is approximately 0.05 Vs. The "−" terminal of the timing capacitor 130 is connected to the substantially constant voltage (0.5 Vs) on the inverting (−) input terminal of the operational amplifier 110. Accordingly, as shown in FIG. 4B, the voltage ($V_{CAP}$) across the timing capacitor 130 from the "+" terminal to the "−" terminal is approximately −0.45 Vs at the beginning of the first half-cycle of each cycle.

The constant current flow from the "−" terminal of the timing capacitor 130 through the timing resistor 136 causes the timing capacitor 130 to charge from the initial negative value through zero volt to a positive value as indicated by a rising portion 230 of the $V_{CAP}$ waveform 202 in FIG. 4B.

As illustrated by a rising portion 232 of the $V_{RAMP}$ waveform 200 in FIG. 4A, the $V_{RAMP}$ voltage on the output terminal of the operational amplifier 110 increases to maintain the charging current through the timing capacitor 110 while maintaining the virtual reference voltage of 0.5 Vs on the inverting (−) input terminal of the operational amplifier 110. Thus, during the first half-cycle, the $V_{RAMP}$ voltage is substantially equal to 0.5 Vs+$V_{CAP}$.

During the first half-cycle when the SW CTRL signal is high, the $V_{SENSE}$ signal line is connected to the output terminal of the operational amplifier 110 via the first switch 132. Accordingly, as illustrated by a rising portion 234 of the $V_{SENSE}$ waveform 204 in FIG. 4B, the $V_{SENSE}$ signal increases with the $V_{RAMP}$ signal during the first half-cycle.

As discussed above, the $V_{SENSE}$ signal is provided to the non-inverting (+) input of the first comparator 160. The reference voltage 0.65 Vs from the second node N2 is provided to the inverting (−) input of the first comparator 160. Accordingly, at the beginning of the first half-cycle, the $V_{SENSE}$ signal has a lower voltage level than the reference voltage, and the voltage on the output terminal of the first comparator 160 is maintained at approximately 0 volt, as shown by a first constant level portion 240 of the D1 waveform 206 in FIG. 4D. The 0-volt level corresponds to a logical 0 value. The inverter 164 inverts the logical 0 value to provide a logical 1 value on the output terminal of the inverter 164, as illustrated by a high level portion 242 on the D2 waveform 208 in FIG. 4D.

When the voltage of the $V_{SENSE}$ signal exceeds the level of the reference voltage on the second node N2 (e.g., greater than approximately 0.65 Vs), the voltage on the output terminal of the first comparator 160 switches from 0 volt to approximately Vs (e.g., approximately 5 volts), as illustrated by a high-level portion 244 of the D1 waveform 206 in FIG. 4D. The high-level portion 240 on the input terminal of the inverter 164 causes the D2 output of the inverter 164 to switch to a logical 0, as illustrated by a portion 246 of the D2 waveform 208 in FIG. 4E.

The switching of the D1 direction signal and the switching of the D2 direction signal have no immediate effect. Rather, the two direction signals are provided as the inputs to the bistable logic circuit 114 to control the next state of the bistable logic circuit 114 when the clock (CLK) signal becomes active.

The $V_{RAMP}$ signal on the output terminal of the operational amplifier 110 is provided to the non-inverting (+) input terminal of the second comparator 162. As discussed above, the inverting (−) input terminal of the second comparator 162 receives the reference voltage on the third node N3, which is approximately 0.95 Vs. As long as the voltage level of the $V_{RAMP}$ signal (illustrated by the rising portion 232 of the waveform 200 in FIG. 4A) is less than the reference voltage on the node N3, the CLK signal on the output terminal of the second comparator 162 is maintained at approximately 0 volt, as illustrated by a constant low level portion 250 of the waveform 210 in FIG. 4F.

When the voltage level on the $V_{RAMP}$ signal exceeds approximately 0.95 Vs, the voltage level on the output terminal of the second comparator 162 switches from the initial low level to a high level as illustrated by a pulse 252 of the waveform 210 in FIG. 4F.

The pulse 252 of the CLK signal corresponds to a logical 1 on the respective first inputs of the first AND-gate 154 and the second AND-gate 156 in the bistable logic circuit 114. As discussed above, the logical 1 on the CLK signal and the logical 1 on the D1 signal causes the signal on the output terminal of the first NOR-gate 150 to switch from a logical 1 to a logical 0 and causes the signal on the output terminal of the second NOR-gate 152 to switch from a logical 0 to a logical 1. Since the SW CTRL signal corresponds to the signal on the output terminal of the first NOR-gate 150, the SW CTRL signal switches to a low logic level as illustrated by the second portion 222 of the waveform 212 in FIG. 4G, which starts the second half of the cycle.

When the SW CTRL signal transitions to the low logic level, the first switch 132 and the second switch 134 switch states. In particular, the respective second input terminal (B) of each switch is electrically coupled to the respective output terminal (O). Accordingly, the connections to the timing capacitor 130 are reversed to the configuration shown in FIG. 3. The "+" terminal of the timing capacitor 130 is connected to the inverting (−) input of the operational amplifier and to the substantially constant virtual reference voltage of 0.5 Vs. The "−" terminal of the timing capacitor 130 is connected to the output terminal of the operational amplifier 110. It should be understood that the references to the "+" terminal and the "−" of the timing capacitor 130 identify the two terminals for reference and do not indicate the polarities of the voltages on the two terminals.

Immediately before the beginning of the second half-cycle, the voltage $V_{CAP}$ across timing capacitor 130 from the "+" terminal to the "−" terminal was approximately +0.45 volts, which corresponds to the difference between the output voltage ($V_{RAMP}$) of approximately 0.95 Vs on the "+" terminal and the reference voltage (0.5 Vs) on the "−" terminal. Immediately after the beginning of the second half-cycle, the voltage across the timing capacitor 130 remains the same. Since the operational amplifier 110 must maintain the voltage on the inverting (−) input terminal at the reference voltage (0.5 Vs) and since the connections to the timing capacitor 130 are now reversed, the voltage on the output terminal of the operational amplifier 110 immediately decreases to 0.05 Vs, as illustrated by a high-to-low transition 260 of the $V_{RAMP}$ waveform 200 in FIG. 4A. The timing capacitor 130 begins to discharge through the timing resistor 136, thus causing the voltage (Vcap) across the timing capacitor 130 to decrease linearly as illustrated by a decreasing portion 262 of the waveform 202 in FIG. 4B.

At the beginning of the second half-cycle, the transition of the $V_{RAMP}$ signal from approximately 0.95 Vs to approximately 0.05 Vs causes the voltage level on the non-inverting "+" input terminal of the second comparator 162 to be lower than the reference voltage level on the inverting "−" input terminal. As illustrated by a high-to-low transition 264 to a low level portion 266 of the CLK waveform 210 in FIG. 4F, the output terminal of the second comparator 162 switches to approximately 0 volt, thus terminating the clock pulse 252. The active duration of the clock pulse 252 depends on the rate at which $V_{RAMP}$ signal decreases on the output terminal of the operational amplifier 110. For example, in the illustrated embodiment, the clock pulse has an active duration of approximately 30 nanoseconds.

As the voltage ($V_{CAP}$) across the timing capacitor 130 decreases, the voltage on the output terminal of the operational amplifier 110 increases linearly to maintain the voltage on the inverting (−) input of the operational amplifier 110 substantially at the virtual reference voltage of 0.5 Vs. As illustrated by a second linearly increasing portion 264 of the waveform 202 in FIG. 4A, the $V_{RAMP}$ voltage increases to 0.5 Vs as the voltage across the capacitor discharges to 0 volt. Since the current continues to flow out of the "+" terminal of the timing capacitor 130 through the timing resistor 136, the magnitude of the voltage ($V_{CAP}$) across the timing capacitor begins to increase; however, because of the reversed connections, the capacitor voltage becomes increasingly negative. Thus, the $V_{RAMP}$ voltage continues to increase in the positive direction to maintain the constant virtual reference voltage on the inverting "−" input terminal of the operational amplifier 110. Although the voltage across the timing capacitor 130 is increasing in the opposite direction during the second half-cycle, the $V_{RAMP}$ voltage on the output terminal of the operational amplifier 110 increases in the same manner as in the first half-cycle.

During the second half-cycle, the Vsense signal line on the output of the first switch 132 is coupled to the inverting "−" input terminal of the operational amplifier 110 and is thus coupled to the substantially constant reference voltage (0.5 Vs), as shown by a constant portion 270 of the $V_{SENSE}$ waveform 204 in FIG. 4C. After the Vsense signal transitions to the constant level, the voltage level on the non-inverting "+" input terminal of the first comparator 160 is lower than the voltage level on the inverting "−" input. Thus, the voltage level on the output terminal of the first comparator 160 switches to a low voltage level corresponding to a logical 0, as illustrated by a portion 272 of the D1 waveform 206 in FIG. 4D. The output terminal of the inverter 164 switches to a high logic level as illustrated by a portion 274 of the D2 waveform 208 in FIG. 4E. Since the voltage level on the $V_{SENSE}$ signal line remains constant during the second half-cycle, the D1 signal remains low throughout the second half-cycle. Thus, the low voltage level portion 272 of the second half-cycle of the first cycle becomes the low voltage level portion 240 of the first half-cycle of the second cycle. Similarly, the D2 signal remains high throughout the second half-cycle, and the high logic level portion 274 of the second half-cycle of the first cycle becomes the high logic level portion 242 of the first half-cycle of the second cycle.

When the voltage on the $V_{RAMP}$ signal reaches the level of the reference voltage on the third node N3 (e.g., 0.95 Vs) during the second half-cycle, the second comparator 162 switches to generate a high level clock (CLK) signal as represented by a second pulse 280 of the waveform 210. The active CLK signal is applied to the first input terminals of the first AND-gate 154 and the second AND-gate 156 in the bistable logic circuit 114, as described above for the first half-cycle. When the CLK signal becomes active during the second half-cycle, the D1 signal is low and the D2 signal is high. Thus, the second NOR-gate 152 is forced to a low logic level and the first NOR-gate 150 is set to a high logic level. Accordingly, the SW CTRL signal on the output of the bistable logic circuit 114 is set to the high logic level 220 to initiate the beginning of new first half-cycle, as illustrated in FIG. 4G.

At the end of the second half-cycle, the timing capacitor 130 is charged to approximately −0.45 Vs, as shown in FIG. 4B (e.g., the voltage on the "+" terminal of the timing capacitor 130 is lower than the voltage on the "−" terminal by approximately 0.45 Vs). When the SW CTRL signal switches to the high logic level at the beginning of the first half-cycle of the second cycle, the electrical connections to the timing capacitor 160 are again reversed to the configuration shown in FIG. 2. In order to maintain the inverting (−) input of the operational amplifier at approximately 0.5 Vs, the output terminal of the operational amplifier 110 transitions to approximately 0.05 Vs at the beginning of the first half-cycle of the second cycle as illustrated by a high-to-low transition 290 of the $V_{RAMP}$ waveform 200 in FIG. 4A. The $V_{SENSE}$ signal is again coupled to the output terminal of the operational amplifier 110 via the first switch 132 and also transitions to approximately 0.05 Vs. The CLK signal pulse 280 ends with a high-to-low transition 292 to the low voltage level portion 250 at the beginning of the second cycle.

As shown by the waveforms in FIGS. 4A-4G, the signals at the beginning of the first half-cycle of the second cycle have the levels described above with respect to the beginning of the first half-cycle of the first cycle. Even if the sawtooth waveform generation circuit 100 initializes in an unknown state or enters such a state because of an electrical disturbance, the operational amplifier 110 will adjust the $V_{RAMP}$ voltage on the output terminal to maintain the voltage on the inverting (−) input terminal substantially at 0.5 Vs thus causing the timing capacitor 130 to charge until the $V_{RAMP}$ voltage reaches approximately 0.95 Vs. The second comparator 162 then generates the active clock (CLK) signal, which causes the bistable logic circuit 114 to switch to a state to change the logic level of the switch control (SW CTRL) signal. Because of the configuration shown in FIG. 1, the timing generation circuit 100 cannot remain in an unknown state and cannot fail to switch at the end of each half cycle.

One skilled in art will appreciate that the foregoing embodiments are illustrative of the present invention. The present invention can be advantageously incorporated into alternative embodiments while remaining within the spirit and scope of the present invention, as defined by the appended claims.

What is claimed is:

1. A sawtooth waveform generator comprising:
   an operational amplifier that generates a ramp voltage on an output terminal;
   a timing circuit that controls the risetime of the ramp voltage generated by the operational amplifier, the timing circuit comprising:
      a capacitor having a first terminal and a second terminal;
      a timing resistor connected to an input terminal of the operational amplifier; and
      a switching circuit that operates during a first interval to connect the first terminal of the capacitor to the output of the operational amplifier and to connect the second terminal of the capacitor to the input terminal of the operational amplifier and the timing resistor, and that operates during a second interval to connect the second terminal of the capacitor to the output of the operational amplifier and to connect the first terminal of the capacitor to the input of the operational amplifier and the timing resistor; and
   a control circuit that controls the switching circuit, the control circuit responsive to the ramp voltage to cause the switching circuit to switch at a predetermined voltage level and responsive to a voltage level on the first terminal of the capacitor to select which of the first terminal and the second terminal of the capacitor to connect to the output terminal of the operational amplifier.

2. The sawtooth waveform generator defined in claim 1, wherein the control circuit comprises:
   a first comparator that compares the ramp voltage to a first predetermined voltage and that generates a clock signal when the ramp voltage is greater than the first predetermined voltage;
   a second comparator that compares a voltage on the first terminal of the capacitor with a second predetermined voltage and that generates a direction signal when the voltage on the first terminal of the capacitor is greater than the second predetermined voltage; and
   a bistable logic circuit responsive to the clock signal and the direction signal to generate a switch control signal having a first state when the direction signal is active and having a second state when the direction signal is not active.

3. A sawtooth waveform generator comprising:
   a timing capacitor having a first terminal and a second terminal;
   an operational amplifier having a first input terminal, a second input terminal and an output terminal, the first input terminal being connected to a fixed voltage source, the second input terminal being connected to a timing resistor, the operational amplifier generating a ramp voltage that varies at a rate determined by the capacitor and the timing resistor;
   a first switch and a second switch that connect the timing capacitor between the output terminal and the second input terminal of the operational amplifier, the first and second switches having a first switch state in which the first terminal of the timing capacitor is connected to the output of the operational amplifier and the second terminal of the timing capacitor is connected to the second input terminal of the operational amplifier to cause current to flow from the second terminal of the timing capacitor and through the timing resistor, the first and second switches having a second state in which the second terminal of the timing capacitor is connected to the output of the operational amplifier and the first terminal of the timing capacitor is connected to the second input terminal of the operational amplifier to cause current to flow from the first terminal of the timing capacitor and through the timing resistor; and
   a control circuit responsive to the ramp voltage and responsive to a voltage on a selected one of the first terminal and the second terminal of the timing capacitor, the control circuit providing a control signal to control the first and second switches, the control signal switching the first and second switches to the first switch state when the ramp voltage reaches a predetermined level and when the voltage on the selected one of the first terminal and the second terminal of the timing capacitor is greater than a selected voltage level, the control signal switching the first and second switches to the second switch state when the ramp voltage reaches the predetermined level and when the voltage on the selected one of the first terminal and the second terminal of the timing capacitor is less than the selected voltage level.

4. A method for generating a sawtooth waveform, comprising:
   connecting one of a first terminal and a second terminal of a timing capacitor to an output terminal of an operational amplifier and connecting the other of the first terminal and the second terminal of the timing capacitor to an input terminal of the operational amplifier and to a timing resistor;
   generating a linearly varying ramp signal from the output terminal of the operational amplifier to charge the timing capacitor;
   monitoring the ramp signal and a voltage on a selected terminal of the timing capacitor until the ramp voltage reaches a predetermined level; and
   performing a selected one of:
      when the ramp signal reaches the predetermined level and the voltage on the selected terminal of the timing capacitor has a first voltage level, switching the connections to the timing capacitor to connect the first terminal of the timing capacitor to the output of the operational amplifier and to connect the second terminal of the timing capacitor to the input terminal of the operational amplifier and to the timing resistor to charge the timing capacitor in a first direction; and
      when the ramp signal reaches the predetermined level and the voltage on the selected terminal of the timing capacitor has a second voltage level, switching the connections to the timing capacitor to connect the second terminal of the timing capacitor to the output of the operational amplifier and to connect the first terminal of the timing capacitor to the input terminal of the operational amplifier and to the timing resistor to charge the timing capacitor in a second direction opposite the first direction.

* * * * *